(12) United States Patent  (10) Patent No.: US 7,251,137 B2
Iijima et al.  (45) Date of Patent: Jul. 31, 2007

(54) ELECTRONIC COMPONENT COOLING APPARATUS

(75) Inventors: Masayuki Iijima, Nagano (JP); Masashi Miyazawa, Nagano (JP); Kouji Ueno, Nagano (JP)

(73) Assignee: Sanyo Denki Co., Ltd., Tokyo (JP)

( * ) Notice: Subject to any disclaimer, the term of this patent is extended or adjusted under 35 U.S.C. 154(b) by 0 days.

(21) Appl. No.: 10/813,328

(22) Filed: Mar. 30, 2004

(65) Prior Publication Data

US 2004/0190250 A1  Sep. 30, 2004

(30) Foreign Application Priority Data

Mar. 31, 2003  (JP) ............................. 2003-097393

(51) Int. Cl.
*H05K 7/20* (2006.01)
*H01L 23/34* (2006.01)
*F28F 7/00* (2006.01)

(52) U.S. Cl. ................ 361/699; 361/698; 257/714; 174/15.1; 174/15.2; 174/252; 165/80.4; 165/80.5; 165/104.33

(58) Field of Classification Search ............... 361/699
See application file for complete search history.

(56) References Cited

U.S. PATENT DOCUMENTS

| | | | |
|---|---|---|---|
| 5,285,347 A | 2/1994 | Fox et al. | |
| 5,519,574 A | 5/1996 | Kodama et al. | |
| 5,526,875 A * | 6/1996 | Lin | 165/80.3 |
| 6,027,307 A * | 2/2000 | Cho et al. | 415/173.5 |
| 6,166,907 A * | 12/2000 | Chien | 361/699 |
| 6,263,957 B1 | 7/2001 | Chen et al. | |
| 6,313,990 B1 | 11/2001 | Cheon | |
| 6,480,385 B2 | 11/2002 | Seshan | |
| 6,510,052 B2 | 1/2003 | Ishikawa et al. | |
| 6,556,439 B2 | 4/2003 | Shibasaki | |
| 6,578,626 B1 * | 6/2003 | Calaman et al. | 165/80.4 |
| 6,728,102 B2 | 4/2004 | Ishikawa et al. | |
| 6,749,012 B2 * | 6/2004 | Gwin et al. | 165/80.4 |
| 6,751,095 B2 | 6/2004 | Ishikawa et al. | |
| 2002/0145853 A1 * | 10/2002 | Grouell et al. | 361/695 |
| 2006/0096742 A1 * | 5/2006 | Bhatti et al. | 165/104.33 |

* cited by examiner

*Primary Examiner*—Boris Chervinsky
*Assistant Examiner*—Zachary Pape
(74) *Attorney, Agent, or Firm*—Rankin, Hill, Porter & Clark LLP

(57) ABSTRACT

An electronic component, cooling apparatus comprises a so-called water-cooled heat sink, a radiator to be cooled by a motor-driven fan, first and second coolant paths for circulating a coolant between the heat sink and the radiator, and a motor-driven pump for giving a moving energy to the coolant. A plurality of engaging pieces of the motor-driven fan and a plurality of engaged portion of the radiator are engaged to connect the motor-driven fan and the radiator.

5 Claims, 12 Drawing Sheets

FIG.8A
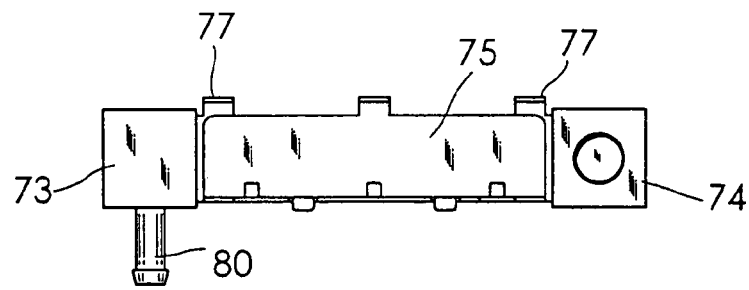
FIG.8C  FIG.8B
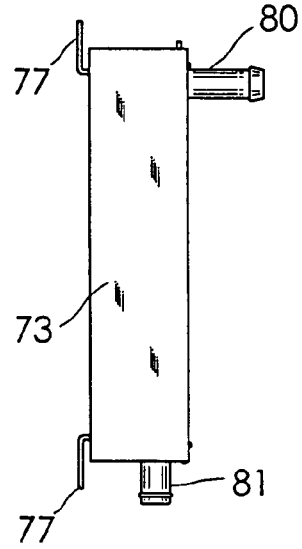 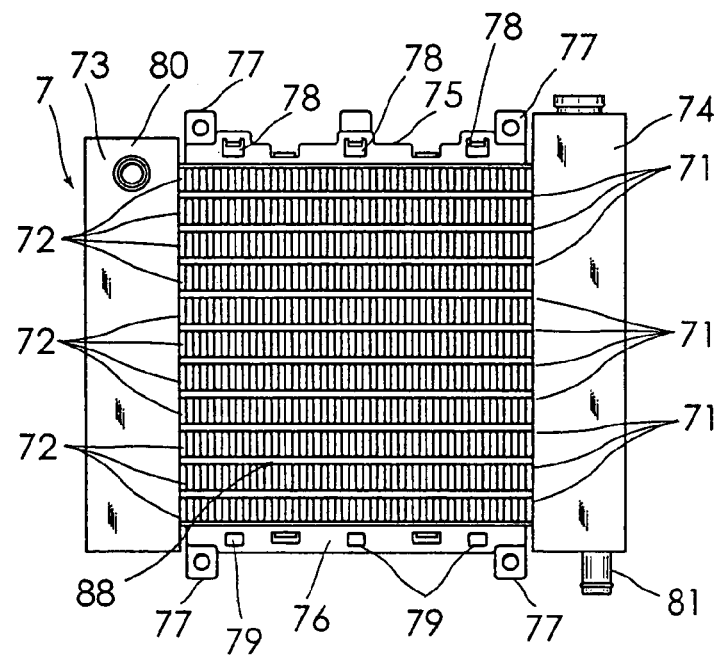
FIG.8D
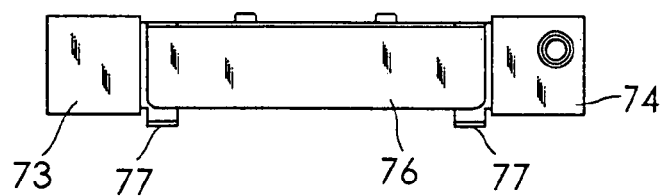

ELECTRONIC COMPONENT COOLING APPARATUS

BACKGROUND OF THE INVENTION

The present invention relates to an electronic component cooling apparatus for forcibly cooling electronic components such as microcomputers and to a motor-driven pump and a radiator used in the electronic component cooling apparatus.

Most of conventional electronic component cooling apparatuses, as disclosed in U.S. Pat. No. 5,519,574, have a combination of a heat sink having a plurality of radiation fins on a surface of a base plate and a motor-driven fan for forcibly cooling these fins and the surface of the base plate.

As an amount of heat generated by electronic components increases, however, a problem arises that simply air-cooling the heat sink cannot cool the electronic components down to a sufficient degree.

SUMMARY OF THE INVENTION

The prevent invention has been made to solve the problems described above. Accordingly, an object of the present invention is to provide an electronic component cooling apparatus that can cool electronic components generating a large amount of heat down to a sufficient level by means of so-called water-cooling.

Another object of the present invention is to provide a small water-cooling type electronic component cooling apparatus.

Still another object of the present invention is to provide an electronic component cooling apparatus that allows a motor-driven fan to be easily mounted at a radiator.

Yet another object of the present invention is to provide an electronic component cooling apparatus in which noise produced by the motor-driven fan mounted on the radiator is small.

A further object of the present invention is to provide an electronic component cooling apparatus having a motor-driven fan with a high air-blowing performance.

A still further object of the present invention is to provide an electronic component cooling apparatus having a water-cooling type heat sink with a higher heat dissipation factor.

A yet further object of the present invention is to provide a motor-driven pump suited for use in the electronic component cooling apparatus.

It is a further object of the present invention to provide a motor-driven pump which is smaller than conventional pumps and capable of suppressing a temperature rise in a bearing and which does not require resupply of a lubricant to the bearing.

It is a still further object of the present invention to provide a motor-driven pump capable of supplying a coolant into a bearing holder reliably and smoothly.

It is a still further object of the present invention to provide a motor-driven pump capable of supplying the coolant reliably into a rotating body.

It is a still further object of the present invention to provide a motor-driven pump with an improved pump performance without increasing a dimension in an axial direction.

It is a still further object of the present invention to provide a motor-driven pump capable of using ball bearings as the bearings therefor.

It is a still further object of the present invention to provide a motor-driven pump which is small in size and has a high cooling performance.

It is a yet further object of the present invention to provide a radiator suited for use in the electronic component cooling apparatus.

It is a yet further object of the present invention to provide a radiator which is small in size and has a high heat exchange efficiency.

It is a yet further object of the present invention to provide a radiator which can prevent a degradation of the cooling performance caused by bubbles getting into a coolant.

An electronic component cooling apparatus of the present invention has a so-called water-cooled heat sink, a radiator cooled by a motor-driven fan, first and second coolant paths for circulating a coolant between the heat sink and the radiator, and a motor-driven pump for giving a moving energy to the coolant.

The heat sink has an electronic component mounting surface on which electronic components to be cooled, such as a CPU, are mounted and a coolant path which has a coolant inlet and a coolant outlet and through which a liquid as a coolant for forcibly cooling the electronic component mounting surface flows. The radiator has a liquid path with a coolant inlet and a coolant outlet, through which a coolant flows and which is air-cooled to cool the coolant. The motor-driven fan is mounted on a heat dissipating portion of the radiator to supply cooling air to the radiator. A first coolant path constructed of, for example, piping connects the coolant outlet of the heat sink to the coolant inlet of the radiator, and a second coolant path joins the coolant outlet of the radiator to the coolant inlet of the heat sink. The motor-driven pump is installed in the first coolant path or the second coolant path to give a moving energy to the coolant.

In this construction, even when a large amount of heat is generated from the electronic components, the heat sink can be positively cooled with the coolant, thus enhancing the cooling performance much better than when the heat sink is cooled only by air.

The motor-driven fan includes: an air channel body having a suction port at one end thereof facing a front of the heat dissipating portion of the radiator and a discharge port at the other end thereof; an impeller having a plurality of blades, at least a part of the impeller being arranged inside the air channel body; a motor for rotating the impeller to draw in air through the suction port and discharge air from the discharge port; and a plurality of engaging pieces integrally provided to the air channel body. In this case the radiator is provided with a plurality of engaged portions with which the plurality of the engaging pieces engage. It is theoretically possible to cool the radiator by blowing air against the heat dissipating portion of the radiator. However, the heat dissipating portion of the radiator is complex in shape and has a large resistance against the air being blown. Hence, it is required for enhancing the cooling efficiency to increase the revolution speed of the motor-driven fan, which in turn generates more noise. On the other hand, a construction in which the motor-driven fan draws in air through the heat dissipating portion of the radiator can discharge heated air from the heat dissipating portion without increasing the rotation speed of the motor-driven fan more than necessary even when the construction of the heat dissipating portion of the radiator is complex. This construction can also reduce noise. Further, if a construction is employed in which the motor-driven fan is mounted at the radiator by engaging the engaging pieces into the engaged portions, the mounting of the motor-driven fan onto the radiator is simplified, thereby enhancing the assembly work efficiency.

Further, if the edges of a plurality of blades facing the front of the heat dissipating portion are sloping gradually away from the dissipating portion as each of the edges extends in a radially outward direction from the rotating center of the impeller, noise can be reduced. Further, if a plurality of webs connecting the housing of the motor and the end portion of the air channel body on the side of the discharge port are situated outside the discharge port, or the end portion on the side of the discharge port is arranged lower than the uppermost surface of the housing of the motor, the air discharge performance can be increased and the load noise can be decreased, compared to when the webs are arranged inside the end portion of the discharge port side of the air channel body.

The heat sink includes: a base plate having the electronic component mounting surface and a heat dissipating surface which is opposite to the electronic component mounting surface in a thickness direction of the base plate and in direct contact with the coolant; a top plate facing the base plate with a predetermined space therebetween; and a peripheral wall portion joining the base plate and the top plate. This heat sink is preferably provided with a coolant inlet and a coolant outlet so that the coolant can flow from one side of the heat dissipating surface to the other side of the heat dissipating surface facing the one side. It is also preferred that the base plate be so shaped in a transverse cross section as to form a resistance increasing portion between the one side and the other side of the heat dissipating surface to increase a resistance against a flow of the coolant. This arrangement causes the coolant that has entered from the coolant inlet into the heat sink to be accelerated in velocity at the resistance increasing portion before being discharged from the coolant outlet. As a result, the heat exchange efficiency can be increased at the resistance increasing portion, which in turn enhances the overall heat exchange efficiency of the heat sink.

A plurality of radiation fins may be integrally provided on the heat dissipating surface of the base plate of the heat sink to enhance the heat exchange efficiency. In that case, the radiation fins preferably extend in a first direction from one side where the coolant inlet is situated toward the other side where the coolant outlet is situated. It is also preferred that the radiation fins be arranged along the heat dissipating surface at predetermined intervals in a second direction perpendicular to the first direction. With the radiation fins arranged in this manner, an efficient heat exchange can be realized by the coolant flowing through passages continuously formed between two adjacent radiation fins. In this case, it is preferred that the coolant inlet and the coolant outlet pierce through the top plate in a thickness direction thereof at positions near the one side and the other side, respectively. With this arrangement, the coolant that has entered from the coolant inlet flows against the heat dissipating surface and diffuses, without extreme imbalance, into a space between the top plate and the base plate. The diffused coolant gathers again toward the coolant outlet and goes out therefrom without imbalance. As a result, the entire heat sink is cooled. In this case, it is preferred that the positions of both ends of the radiation fins in the first direction be determined so that the speed of the coolant does not vary excessively greatly among flow passages as the coolant flows in through the coolant inlet and flows out from the coolant outlet through the flow passages each formed between two adjacent radiation fins.

The electronic component cooling apparatus of the present invention may use a variety of motor-driven pumps. The inventor of this invention invented a small motor-driven pump suited for use with the electronic component cooling apparatus. The small motor-driven pump comprises: a rotor having a rotating body, a plurality of rotary side magnetic poles and a shaft. The rotating body has a cylindrical peripheral wall portion and a closing wall portion integrally formed with the peripheral wall portion to close one end of an inner space enclosed by the peripheral wall portion. The rotary side magnetic poles are formed with permanent magnets and arranged on an inner peripheral surface of the peripheral wall portion. The shaft is fixed at one end thereof to a center of the closing wall portion and extends through a center of the peripheral wall portion. The motor-driven pump also comprises bearings for rotatably supporting the shaft; a cylindrical bearing holder in which the bearings are fitted and held; a retainer mechanism arranged between the other end of the shaft and one of the two bearings which is situated far side from the closing wall portion and adapted to prevent the shaft from coming off; a stator having a stator core mounted on an outer periphery of the bearing holder and arranged inside the rotating body and a plurality of excitation coils wound around the stator core; an exciting current supply circuit for supplying an exciting current to the plurality of excitation coils; and a waterproof structure including a seal member for watertightly closing one of open ends of the bearing holder which does not face the closing wall portion of the rotating body. The waterproof structure is adapted to waterproof the stator and the exciting current supply circuit. The motor-driven pump also comprises an impeller having a blade mounting portion arranged on at least the closing wall portion of the rotating body and a plurality of blades provided at the blade mounting portion; and a housing having a liquid inlet and a liquid outlet and accommodating therein elements such as the rotor, the impeller and the stator. When the rotor, the impeller and the bearings are submerged in the coolant and the impeller is rotated, the housing draws in the liquid coolant from the liquid inlet and discharges it from the liquid outlet.

In the construction of this motor-driven pump, the stator core is situated on the outer periphery of the bearing holder, with the rotor turning outside the stator core. This construction can reduce the axial dimension of the motor-driven pump and also enhance the pump performance by taking full advantage of the inertia of the rotor. Further, in this construction, since the liquid enters into the interior of the bearing holder, heat from the stator can also be released through the bearing holder to the liquid flowing through the interior of the pump. Further, because the liquid entering into the bearing holder serves as a lubricant for the bearings, there is no need to replenish the lubricant to the bearings, significantly extending the life of the motor-driven pump. Another advantage of this construction is that since it eliminates the need for supplying a lubricant to the bearings, ball bearings can be used as the bearings.

While a single bearing may be used, two bearings are preferably used to ensure a stable support of the shaft. In this case, it is preferred that at least one liquid path extending along the shaft be formed between the inner peripheral surface of the bearing holder and the outer peripheral surface of the two bearings. This liquid path allows a whole interior of the bearing holder, including a space formed between the two bearings in the bearing holder, to be completely filled with the flowing liquid. This liquid path can be formed by forming at least one groove extending along the shaft in at least the inner peripheral surface of the bearing holder or the outer peripheral surface of the bearings. At least one groove extending along the shaft should preferably be formed in that part of the inner peripheral surface of the bearing holder which faces the outer peripheral surface of the bearings rather than to be formed in the outer peripheral surface of the bearings, and then ready made bearings can be used. When a plurality of grooves are to be formed, they are preferably formed at equal intervals in the peripheral direction. This arrangement can eliminate a possibility that the presence of the plurality of grooves may put the center of the bearings out of alignment with the center of the bearing holder. Further, the inner peripheral surface of the bearing holder may be formed with one or more narrow elongate grooves that extend along the shaft and face the outer peripheral surfaces of both of the two bearings. The one or more narrow elongate grooves may be used as the liquid path. This arrangement makes it easy to form the grooves which face both of the bearings.

Further, the closing wall portion of the rotating body may be formed with one or more through-holes piercing therethrough in a thickness direction thereof to allow the coolant to flow through the closing wall portion. The through-holes ensure a smooth flow of the liquid between the interior and the exterior of the rotating body. When the blade mounting portion of the impeller has a portion that almost entirely faces the closing wall portion of the rotating body, it is necessary to form also in this portion one or more through-holes that are aligned with the one or more through-holes formed in the closing wall portion.

The blade mounting portion of the impeller may be provided with a cylindrical extended mounting portion extending along the peripheral wall portion of the rotating body. Further, the plurality of blades may each be shaped to extend continuously from over the blade mounting portion to over the cylindrical extended mounting portion. This arrangement can make the most of the outer surface of the rotating body in forming long blades, thereby enhancing the performance of the motor-driven pump.

Further, since no shaft fixing brackets exist in the space in which the impeller rotates, nothing obstructs the liquid inflow, improving the pump performance.

The radiator used in the electronic component cooling apparatus can have any desired construction as long as it can be formed as small as possible. The inventor developed a construction suited for such a radiator. This radiator comprises: a plurality of liquid passages arranged side by side; radiation fins attached to outer surfaces of the liquid passages; two liquid tanks arranged one on each side of the plurality of liquid passages and communicably connected to both ends of the plurality of liquid passages; and a liquid inlet and a liquid outlet provided in one and the other of the two liquid tanks respectively. Furthermore, a chamber in each of the two liquid tanks is divided, in a direction of arrangement of the plurality of liquid passages, into m plus one (m is an integer of one or more) sub-chambers by m partition walls. Then the sub-chambers in each of the two liquid tanks and the plurality of liquid passages are connected with each other in such a manner that one or more of the liquid passages function as liquid paths winding between the liquid inlet and the liquid outlet. In this radiator, since the liquid path is constructed of one or more winding liquid passages, the liquid path can be lengthened and the heat exchange efficiency enhanced.

The liquid inlet and the liquid outlet can be provided only in one of the two liquid tanks. In this construction, the one of the tank provided with the liquid inlet and outlet therein, in a direction of arrangement of the plurality of liquid passages, is divided into n plus one (n is integer of two or more) sub-chambers by n partition walls, while the other tank, in a direction of arrangement of the plurality of liquid passages, is divided into n sub-chambers by n minus one partition walls. In this kind of radiator, since both of the liquid inlet and the liquid outlet are provided in one of the liquid tanks, a space for locating a first coolant path and a second coolant path connected respectively to the liquid inlet and the liquid outlet can be made smaller.

The two liquid tanks can be so arranged that the uppermost sub-chamber in one of the two tanks is situated higher than the uppermost sub-chamber in the other tank. Also, the uppermost sub-chamber of the one tank situated higher than the uppermost sub-chamber of the other tank is formed in such a size and dimension as to allow a space to be defined therein—that is not filled with the liquid. In this arrangement, bubbles that may get into the liquid stay in the space, thereby effectively preventing degraded cooling efficiency to be caused when the bubbles get into the liquid.

BRIEF DESCRIPTION OF THE DRAWINGS

These and other objects and many of the attendant advantages of the present invention will become better understood by reference to the following detailed description when considered in connection with the accompanying drawings.

FIGS. 8A to 8D are a plan view, a front view, a left side view and a bottom view of a radiator used in the electronic component cooling apparatus of FIG. 1.

DETAILED DESCRIPTION OF PREFERRED EMBODIMENTS

Figure 1:
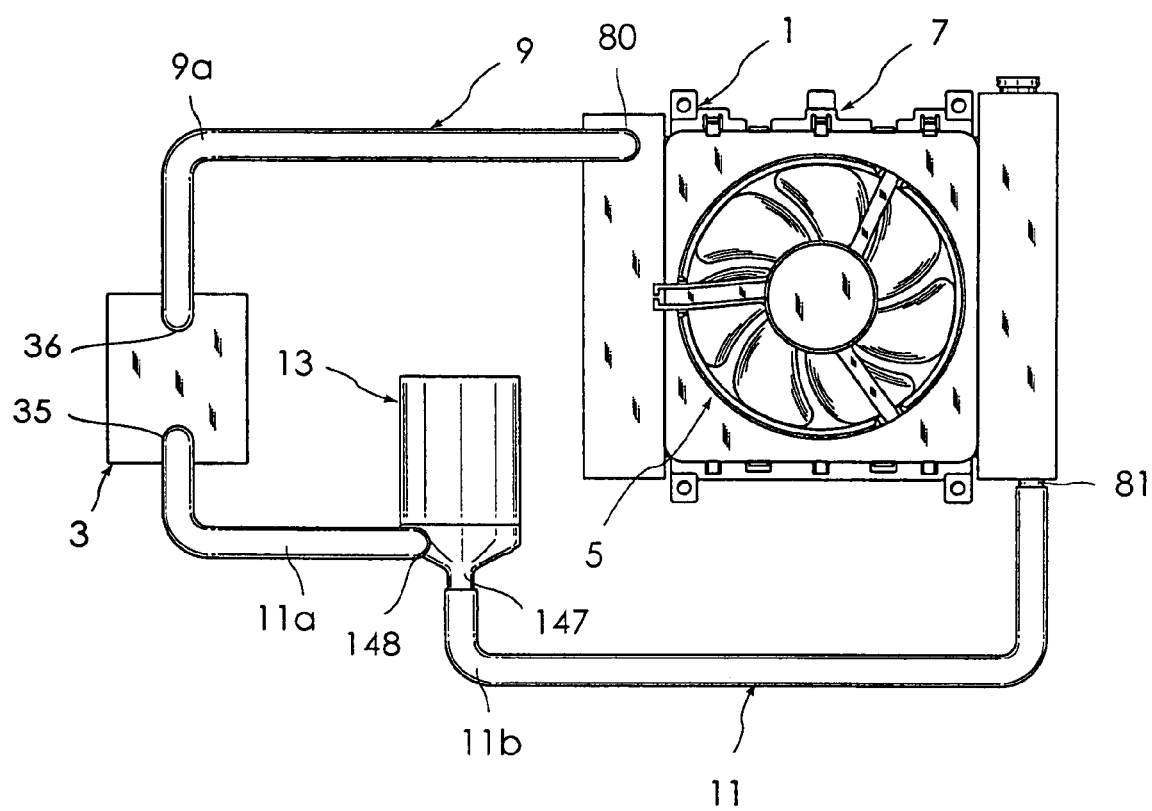
FIG. 1 is a plan view showing a configuration of an embodiment of an electronic component cooling apparatus according to the present invention.
Figure 2A:
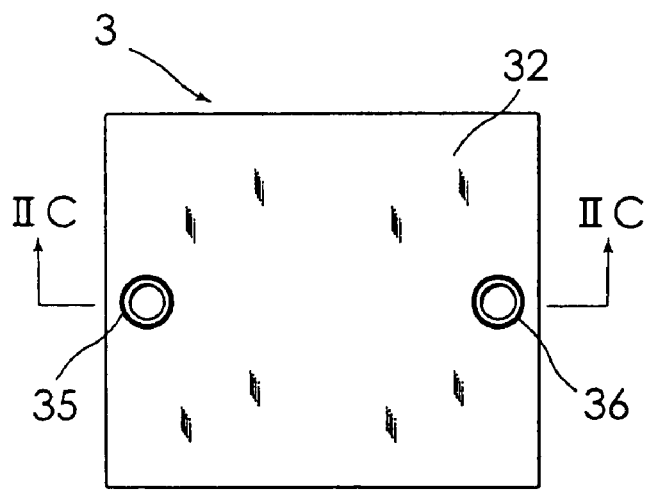
FIGS. 2A and 2B are a plan view and a side view of a heat sink used in the electronic component cooling apparatus of FIG. 1.
Figure 2B:
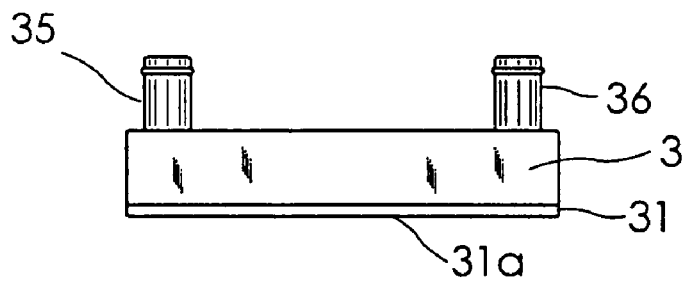
Figure 2C:
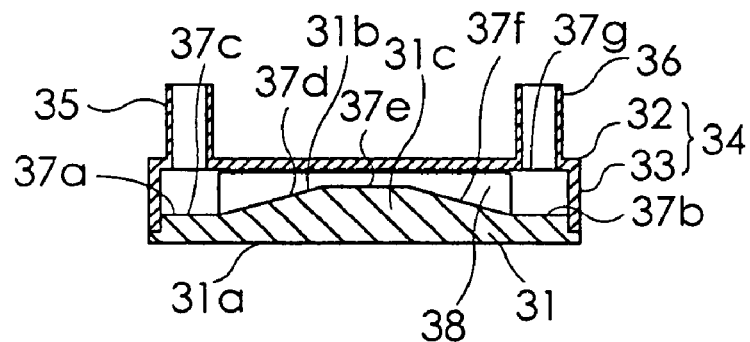
FIG. 2C is a cross-sectional view taken along the line IIC-IIC of FIG. 2A.
Figure 2D:
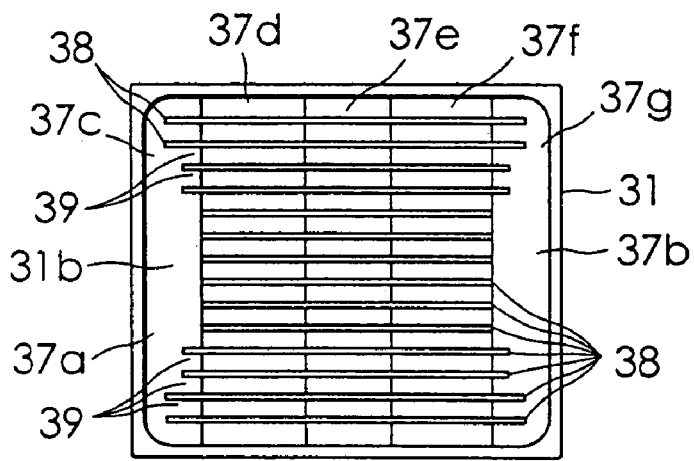
FIG. 2D is a plan view of a base plate.

Now, by referring to the accompanying drawings, one embodiment of an electronic component cooling apparatus according to the present invention will be described in detail. FIG. 1 is a plan view showing a construction of embodiment of an electronic component cooling apparatus 1 according to the present invention. The electronic component cooling apparatus 1 has a water-cooled heat sink 3 having a coolant path therein, a radiator 7 cooled by a motor-driven fan 5, and a motor-driven pump 13 for giving a moving energy to the coolant in order to circulate the coolant between the heat sink 3 and the radiator 7.

The heat sink 3 has an electronic component mounting surface for mounting electronic components, such as a CPU, to be cooled. Also the heat sink 3 has a coolant path, with a coolant inlet (a cylindrical member 35) and a coolant outlet (a cylindrical member 36), through which a liquid coolant flows to forcibly cool the electronic component mounting surface. The radiator 7 has a liquid path, with an inlet 80 and an outlet 81, through which the coolant flows and which is air-cooled by dissipating heat from the coolant. The motor-driven fan 5 is mounted on a heat dissipating portion of the radiator 7 to supply cooling air to the radiator 7. The first coolant path 9 constructed of pipes or others joins the coolant outlet 36 of the heat sink 3 to the coolant inlet 80 of the radiator 7, and the second coolant path 11 joins the coolant outlet 81 of the radiator 7 to the coolant inlet 35 of the heat sink 3.

As shown in FIG. 2, the heat sink 3 comprises a base plate 31 and a top plate case 34 and has a coolant path formed therein. The base plate 31 is made of a metal with a high heat conductivity, such as copper and aluminum, and has an electronic component mounting surface 31a, and a heat dissipating surface 31b which is in direct contact with the coolant and faces the electronic component mounting surface 31a in the thickness direction of the base plate. The top plate case 34 has a top plate 32 facing the base plate 31 with a predetermined gap therebetween and a peripheral wall portion 33 connecting the base plate 31 and the top plate 32. While the top plate case 34 may be formed of a metal with a high heat conductivity such as copper and aluminum, like a base plate 31, it can also be integrally formed of a synthetic resin material. The top plate case 34 is integrally formed with a cylindrical member 35 constituting the coolant inlet and a cylindrical member 36 constituting the coolant outlet. It is preferred that the coolant inlet (the cylindrical member 35) and the coolant outlet (the cylindrical member 36) be arranged so that the coolant flows from one side 37a toward the other side 37b of the heat dissipating surface 31b of the base plate 31. The base plate 31, when viewed in a transverse cross section, is so defined that a resistance increasing portion 31c which increases a resistance against the flow of the coolant is formed between the sides 37a and 37b of the heat dissipating surface 31b.

The resistance increasing portion 31c consists of three portions. In the first portion the heat dissipating surface 31b is formed as an inclined surface 37d which goes up from a non-inclined surface 37c at one side 37a in such a manner that the thickness of the resistance increasing portion 31c gradually increases; in the second portion that follows the inclined surface 37d, the heat dissipating surface 31b is formed as a non-inclined surface 37e which extends so that the thickness of the resistance increasing portion 31c is constant; and in the third portion following the non-inclined surface 37e, the heat dissipating surface 31b is formed as an inclined surface 37f which goes down toward the other side 37g in such a manner that the thickness of the resistance increasing portion 31c gradually decreases. This arrangement ensures that the coolant that enters the heat sink 3 from the coolant inlet (the cylindrical member 35) is accelerated in velocity at the resistance increasing portion 31c before being discharged from the coolant outlet (the cylindrical member 36). As a result, the heat exchange efficiency can be improved at resistance increasing portion 31c, which in turn enhances the heat exchange efficiency of the heat sink 3.

In this example, a plurality of radiation fins 38 are integrally provided on the heat dissipating surface 31b of the base plate 31 in the heat sink 3 to enhance the heat exchange efficiency. The plurality of radiation fins 38 each have a plate-like shape and contact, with the inner surface of the top plate 32. The plurality of radiation fins 38 extend in a first direction (a lateral direction in the drawing) from the one side 37a where the coolant inlet (35) is situated toward the other side 37b where the coolant outlet (36) is situated, and are arranged along the heat dissipating surface 31b at predetermined intervals in a second direction (a vertical direction in the drawing) perpendicular to the first direction. With the radiation fins 38 arranged in this manner, an efficient heat exchange can be realized by the coolant flowing through flow passages 39 continuously formed between two adjacent radiation fins 38, 38. In this case, the coolant inlet (35) and the coolant outlet (36) pierce through the top plate 32 in the thickness direction of the top plate at positions corresponding to the central part of each side 37a, 37b respectively. With this arrangement, the coolant that enters at the coolant inlet (35) goes against the heat dissipating surface 31b and diffuses, without excessive imbalance, into a space between the top plate 32 and the base plate 31. The diffused coolant then gathers evenly toward the coolant outlet (36) and goes out therefrom. As a result, the entire heat sink 3 is cooled. In this example, the positions of the both ends of the radiation fins 38 in the first direction are so determined that the flow speeds of the coolant do not vary excessively among flow passages 39 each formed between two adjacent radiation fins 38, 38 as the coolant flows in through the coolant inlet (35) and flows out of the coolant outlet (36) through the flow passages 39. The cylindrical member 36 is connected with one end of a pipe 9a, for example a metal pipe, forming the first coolant path 9. The cylindrical member 35 is connected with one end of a pipe 11a, for instance a metal pipe, forming a part of the second coolant path 11. The other end of the pipe 11a is connected to a cylindrical member 148 that forms a liquid outlet of the motor-driven pump 13. A cylindrical member 147 forming a liquid inlet of the motor-driven pump 13 is connected to a cylindrical member 81 forming a liquid outlet of the radiator 7 through a pipe 11b, such as a metal pipe forming a part of the second coolant path 11.

Figure 3A:
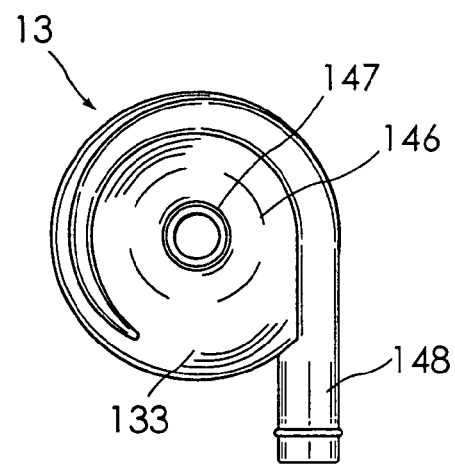
FIGS. 3A and 3B are a plan view and a front view of a motor-driven pump used in the electronic component cooling apparatus of FIG. 1.
Figure 3B:
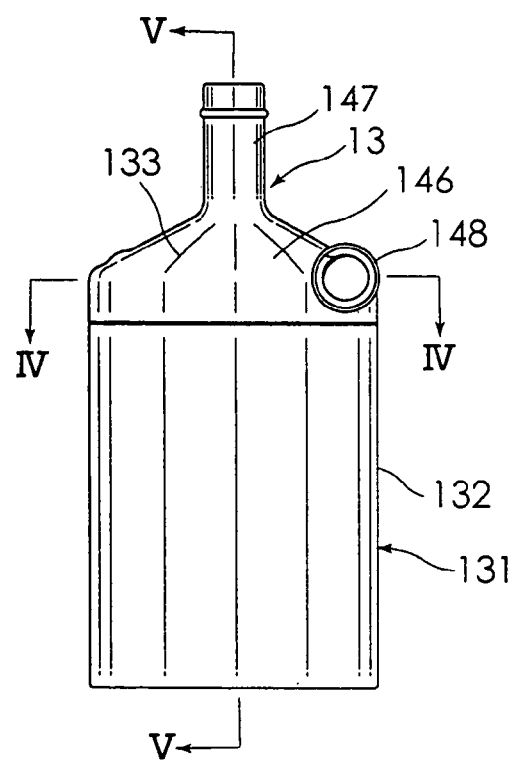
Figure 4:
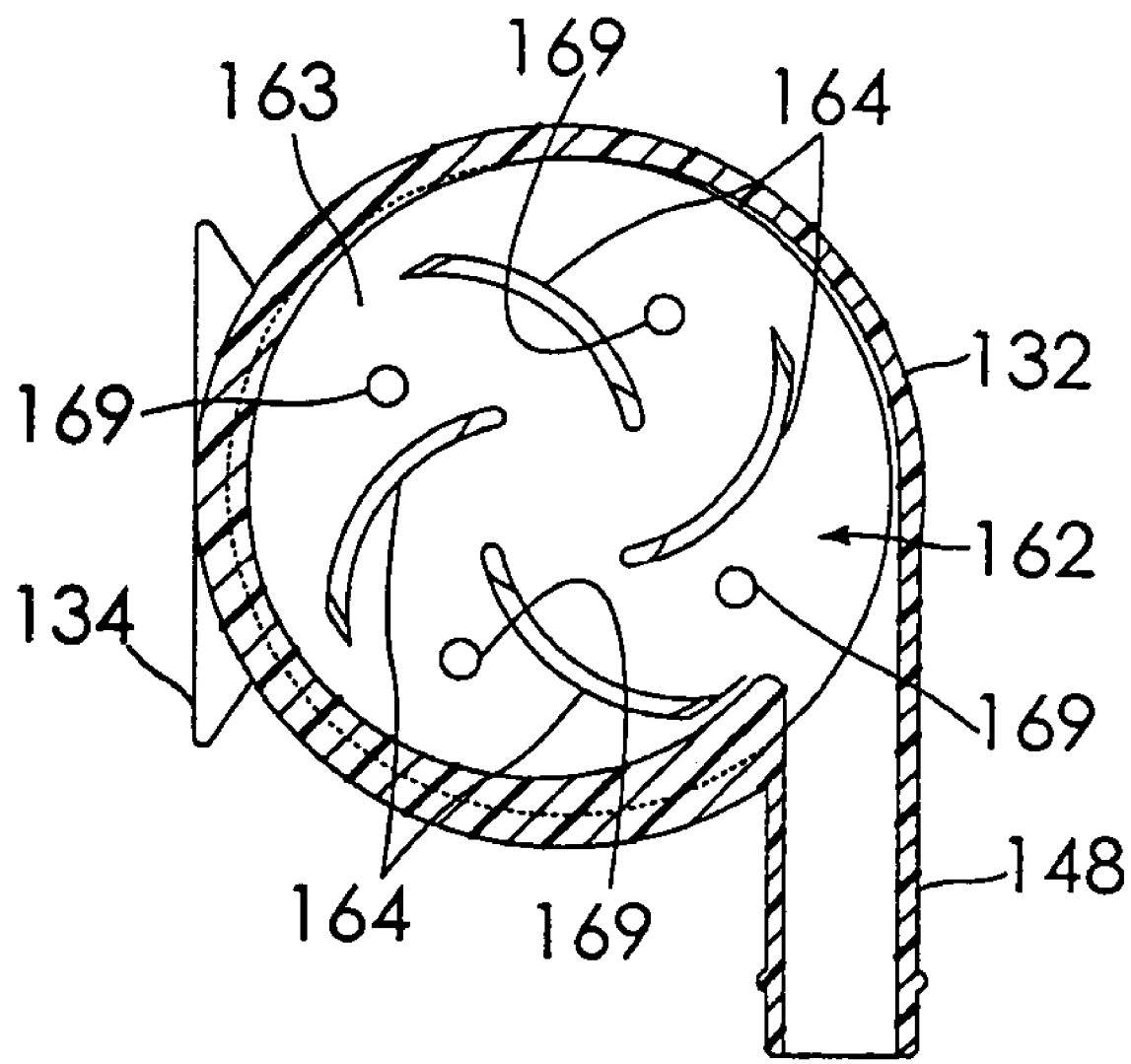
FIG. 4 is a cross-sectional view taken along the line IV-IV of FIG. 3B.
Figure 5:
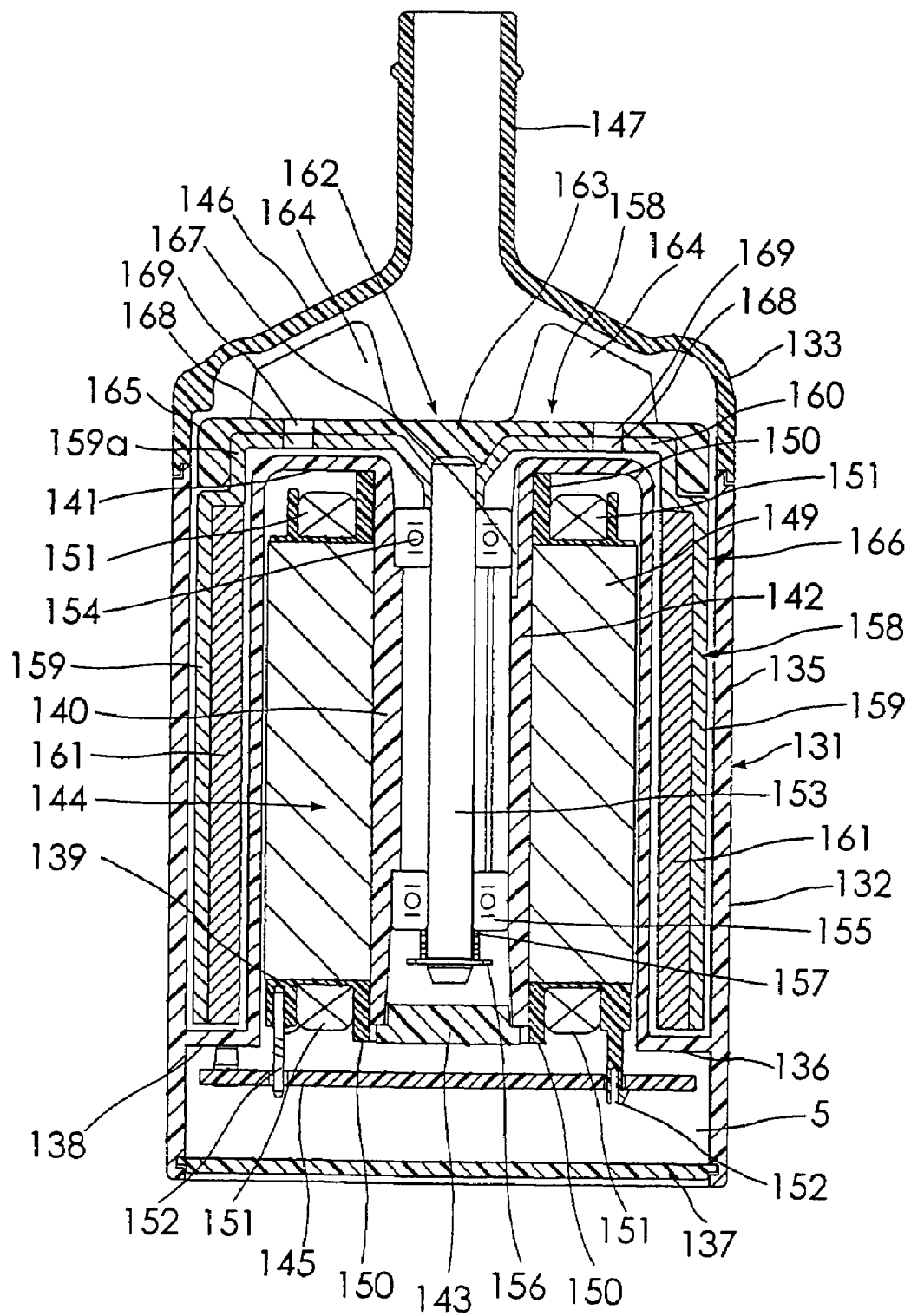
FIG. 5 is an enlarged cross sectional view taken along the line V-V of FIG. 3B.

The motor-driven pump 13 is installed in the second coolant path 11 to give a moving energy to the coolant. FIG. 3A and FIG. 3B represent a plan view and a front view of the motor-driven pump 13 respectively. FIG. 4 is a cross section taken along the line IV-IV of FIG. 3B. FIG. 5 is an enlarged cross section taken along the line V-V of FIG. 3B. The motor-driven pump 13 has a housing 131. The housing 131 comprises a housing body 132 of synthetic resin and a cover member 133 of synthetic resin. As shown in FIG. 5, the housing body 132 comprises an outer cylindrical portion 135 with open ends, a partition wall portion 136 provided inside, and formed integrally with, the outer cylindrical portion 135, and a bottom wall portion 137 fitted to one end (lower end) of the outer cylindrical portion 135 to close that end. The partition wall portion 136 comprises a first annular portion 138 formed integrally with an inner wall of the outer cylindrical portion 135 and protruding radially inwardly; a first inner cylindrical portion 139 provided integrally at an inner end of the first annular portion 138 and extending in a direction perpendicular to the direction in which the first annular portion 138 extends (an axial direction); a second inner cylindrical portion 140 situated inside the first inner cylindrical portion 139 and extending axially; and a second annular portion 141 situated at the cover member 133 side and connecting the first and second inner cylindrical portions 139, 140 at one end. In this example, a major part of the second inner cylindrical portion 140 forms a bearing holder 142. The other end of the second inner cylindrical portion 140 is fitted to secure a cap (seal member) 143 in a sealing structure and thus closed. In this example, the partition wall portion 136 and the cap 143 combine to construct a waterproof structure that prevents a liquid from getting into a space S. A stator 144 and a printed circuit board 145 described later are received in the space S enclosed by a part of the outer cylindrical portion 135, the cylindrical partition wall portion 136, the bottom wall portion 137 and the cap 143.

As shown in FIG. 3, the cover member 133 has a hollow cover member body 146 with its open end fused to the open end of the outer cylindrical portion 135 (FIG. 5) of the housing body 132, a cylindrical member 147 axially extending from the center of the cover member body 146 to form a liquid inlet, and a cylindrical member 148 tangentially extending from the side of the cover member body 146 to form a liquid outlet.

Returning to FIG. 5, the stator 144 has a stator core 149 mounted on an outer periphery of the bearing holder 142, a synthetic resin slot insulator 150 fitted to the stator core 149, and a plurality of excitation coils 151 wound on poles of the stator core 149 through the slot insulator 150. Leaders of the excitation coils 151 are connected to a plurality of conductive pins 152 secured to the slot insulator 150. The conductive pins 152 are fitted into connection through-holes provided in the circuit board 145 that has an exciting current supply circuit for supplying exciting currents to the excitation coils 151.

Inside the bearing holder 142, two bearings 154, 155 (in this example, ball bearings) that rotatably support a shaft 153 are fitted. These two bearings 154, 155 are inserted into the bearing holder 142 from openings at both ends thereof.

A retainer 156 and a coil spring 157 are fitted over the end of the shaft 153 on the cap 143 side. The coil spring 157 is installed, being compressed between an inner race of the bearing 155 and the retainer 156. In this example, the coil spring 157 and the retainer 156 together form a slip-off prevention mechanism. With this construction, nothing stands in the way of the liquid inflow into the space where an impeller rotates, which enhances the pump performance.

A rotating body 158 is secured to an end of the shaft 153 at the cover member 133 side. The rotating body 158 is made from a magnetically permeable material and has a cylindrical peripheral wall portion 159 and a closing wall portion 160 formed integrally with the peripheral wall portion 159 so as to close one end of an inner space enclosed by the peripheral wall portion 159. The end of the shaft 153 is tightly fitted into a through-hole formed in the center of the closing wall portion 160. A plurality of rotary side magnetic poles 161 made from permanent magnets are secured onto the inner surface of the peripheral wall portion 159 of the rotating body 158. An impeller 162 is secured to the top of the closing wall portion 160 of the rotating body 158. The impeller 162 has a blade mounting portion 163 fixed to the closing wall portion 160 and a plurality of blades 164 integrally provided at the surface of the blade mounting portion 163. In this example, a reduced diameter portion 159a is formed at one end of the peripheral wall portion 159 of the rotating body 158. An annular extension portion 165 which snugly fits over the outer periphery of the reduced diameter portion 159a is integrally formed at the outer peripheral portion of the blade mounting portion 163 of the impeller 162. In this motor-driven pump, a rotor 166 is made of parts ranging from the rotating body 158 to the extension portion 165. In this pump, the rotor 166, the impeller 162 and the bearings 154, 155 are submerged in the coolant. When the impeller 162 rotates, the pump draws in a liquid through the liquid inlet (147) and discharges it from the liquid outlet (148).

In this motor-driven pump 13, the stator core 144 is situated on the outer periphery of the bearing holder 142, and the rotor 166 rotates outside the stator core. This construction can reduce the axial dimension of the motor-driven pump 13 and can also enhance the pump performance by making the most of the inertia of the rotor 166. Further, in this construction, since the liquid gets into the interior of the bearing holder 142, heat from the stator 144 can also be released through the bearing holder 142 to the liquid flowing through the interior of the pump. Further, because the liquid getting into the bearing holder 142 functions as a lubricant for the bearings 154, 155, there is no need to replenish the lubricant to the bearings 154, 155, which significantly extends the life of the motor-driven pump 13.

In this motor-driven pump 13, at least one liquid path 167 extending along the shaft 153 is formed between the inner peripheral surface of the bearing holder 142 and the outer peripheral surface of the two bearings 154, 155. In FIG. 5 only one liquid path 167 is shown. The liquid path 167 allows the whole interior of the bearing holder 142, including the space formed between the two bearings 154, 155 in the bearing holder 142, to be completely filled with the flowing liquid. The liquid path 167 can be formed by forming at least one groove extending along the shaft 153 in at least either the inner peripheral surface of the bearing holder 142 or the outer peripheral surface of the bearings 154, 155.

One or more (in this case, four) through-holes 168 piercing therethrough in the thickness direction thereof to allow the coolant to flow therethrough are formed on the closing wall portion 160 of the rotating body 158. Four through-holes 169 aligned with the four through-holes 168 of the closing wall portion 160 are formed on the blade mounting portion 163 of the impeller 162. Forming these through-holes 168, 169 ensures a smooth flow of liquid between the interior and the exterior of the rotating body 158.

Figure 6A:
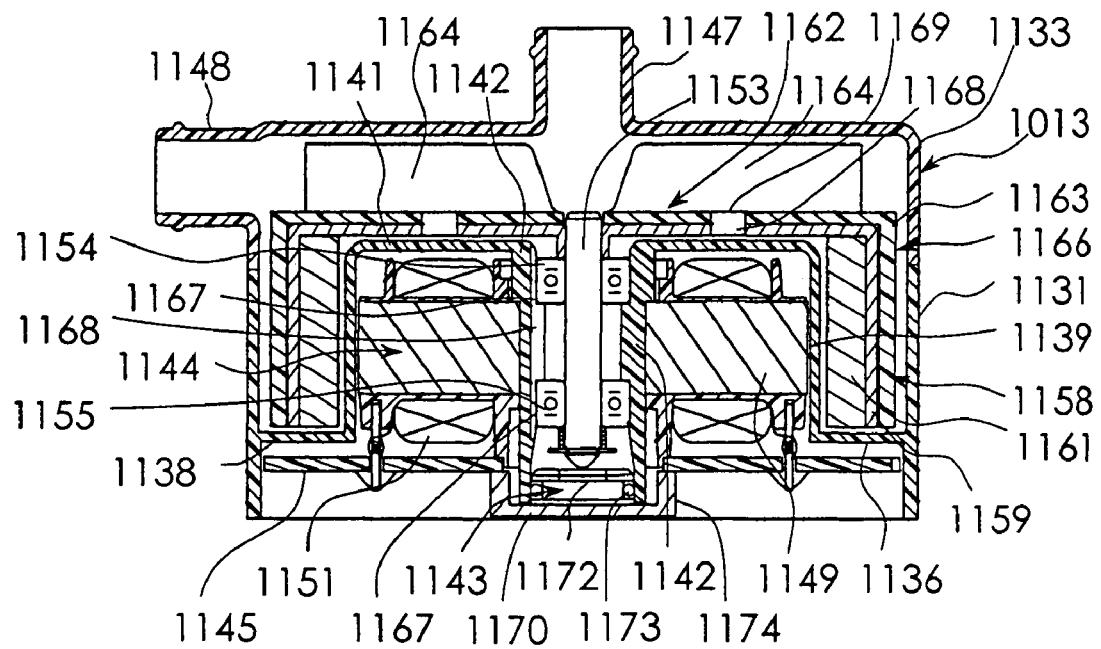
FIG. 6A is a cross-sectional view showing another example of a motor-driven pump used in the present invention.
Figure 6B:
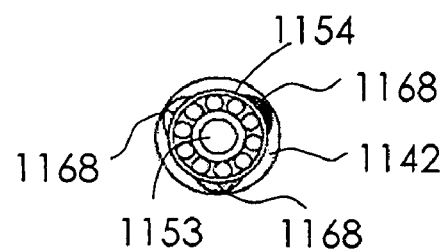
FIG. 6B is a horizontal cross-sectional view showing the shaft and surroundings thereof of the motor-driven pump indicated of FIG. 6A.

FIG. 6A is a cross-sectional view showing another example of a motor-driven pump 1013 used in the present invention. The motor-driven pump 1013 has a smaller axial dimension than that of the preceding example of the motor-driven pump 13 shown in FIG. 3 to FIG. 5. Regarding those parts of this motor-driven pump 1013 that are identical in construction with the corresponding parts of the motor-driven pump 13 shown in FIG. 3 to FIG. 5, the explanation of the parts is omitted here by indicating each reference number added 1000 to the corresponding reference number shown in FIG. 3 to FIG. 5. In this motor-driven pump 1013, three grooves 1167 continuously extending along a shaft 1153 are formed in that portion of the inner peripheral surface of a bearing holder 1142 which faces the outer peripheral surface of the bearings 1154, 1155. These three grooves 1167 constitute liquid paths. The three grooves 1167 are formed at equal intervals in the circumferential direction of the shaft 1153, as shown in FIG. 6B. This arrangement can eliminate a possibility that the presence of the three grooves 1167 may cause the centers of the bearings 1154, 1155 out of alignment with the center of the bearing holder 1142. The grooves 1167 extend along the shaft 1153 and have a narrow elongate shape, facing the outer peripheral surface of the two bearings 1154, 1155. In this example, a housing body 1132 is not provided with a bottom wall portion. A cap 1143 has an annular recess 1172 formed in the outer peripheral portion thereof, in which an O-ring 1173 is fitted to form a seal portion. The cap 1143 is attached with an end cover 1174 that engages the end of the bearing holder 1142. In other respects, the construction of the motor-driven pump is essentially the same as that of the motor-driven pump shown in FIG. 3 to FIG. 5.

Figure 7:
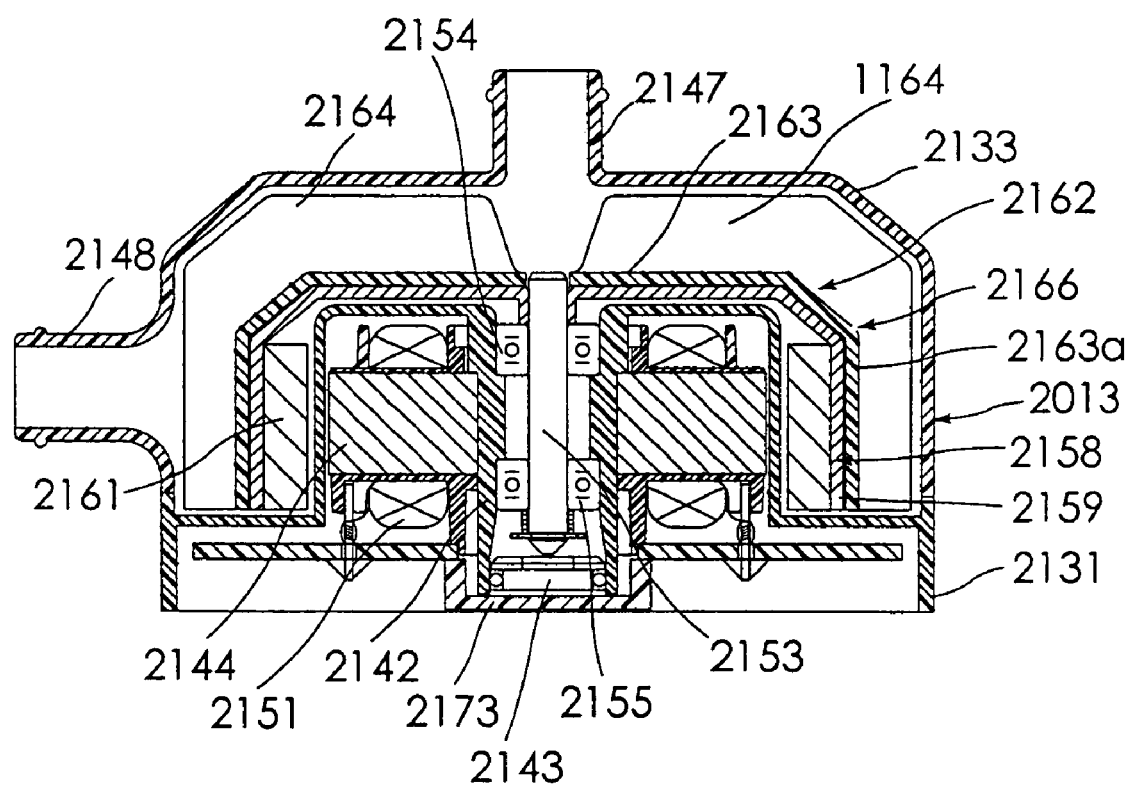
FIG. 7 is a cross-sectional view showing still another example of a motor-driven pump used in the present invention.

FIG. 7 is a cross-sectional view showing still another example of a motor-driven pump 2013 used in the present invention. The motor-driven pump 2013, as with the motor-driven pump shown in FIG. 6A, has a reduced axial dimension when compared with the motor-driven pump 13 shown in FIG. 3 to FIG. 5. Regarding those parts of this motor-driven pump 2013 that are identical in construction with the corresponding parts of the motor-driven pump 13 shown in FIG. 3 to FIG. 5, the explanation of the parts is omitted here by indicating each reference number added 2000 to the corresponding reference number shown in FIG. 3 to FIG. 5. In this motor-driven pump 2013, a blade mounting portion 2163 of an impeller 2162 is provided with a cylindrical extended mounting portion 2163a that extends along a peripheral wall portion 2159 of a rotating body 2158. A plurality of blades 2164 may be formed so as to extend continuously from over the blade mounting portion 2163 to over the cylindrical extended mounting portion 2163a. This arrangement can make the most of the outer surface of the rotating body 2158 in forming long blades, thereby enhancing the performance of the motor-driven pump.

FIGS. 8A to 8D are a plan view, a front view, a left side view and a bottom view of a radiator 7 which is used in a system configuration of the embodiment of FIG. 1. This radiator 7 includes ten liquid passages 71 arranged in parallel in a vertical direction and bellows-like radiation fins 72 attached to the outer surfaces of the liquid passages 71. Two liquid tanks 73, 74 are connected with and communicate with both ends of the ten liquid passages 71, and arranged on either side of the ten liquid passages 71, respectively. On the both sides, with respect to the vertical arrangement direction of the ten liquid passages 71, are provided motor-driven mounting brackets 75, 76. The motor-driven mounting brackets 75, 76 are formed by stamping and bending a metal plate. They have a plurality of screw insertion projections 77 each formed with a through-hole in which a mounting screw can be inserted. The motor-driven mounting brackets 75, 76 have a plurality of holes 78, 79 as engaged portions respectively to which engaging pieces 56, 57 of the motor-driven fan 5 are fastened when fixing the fan 5. In this radiator 7, the ten liquid passages 71 shown in FIG. 8B and the radiation fins 72 together constitute a heat dissipating portion 88.

Figure 9:
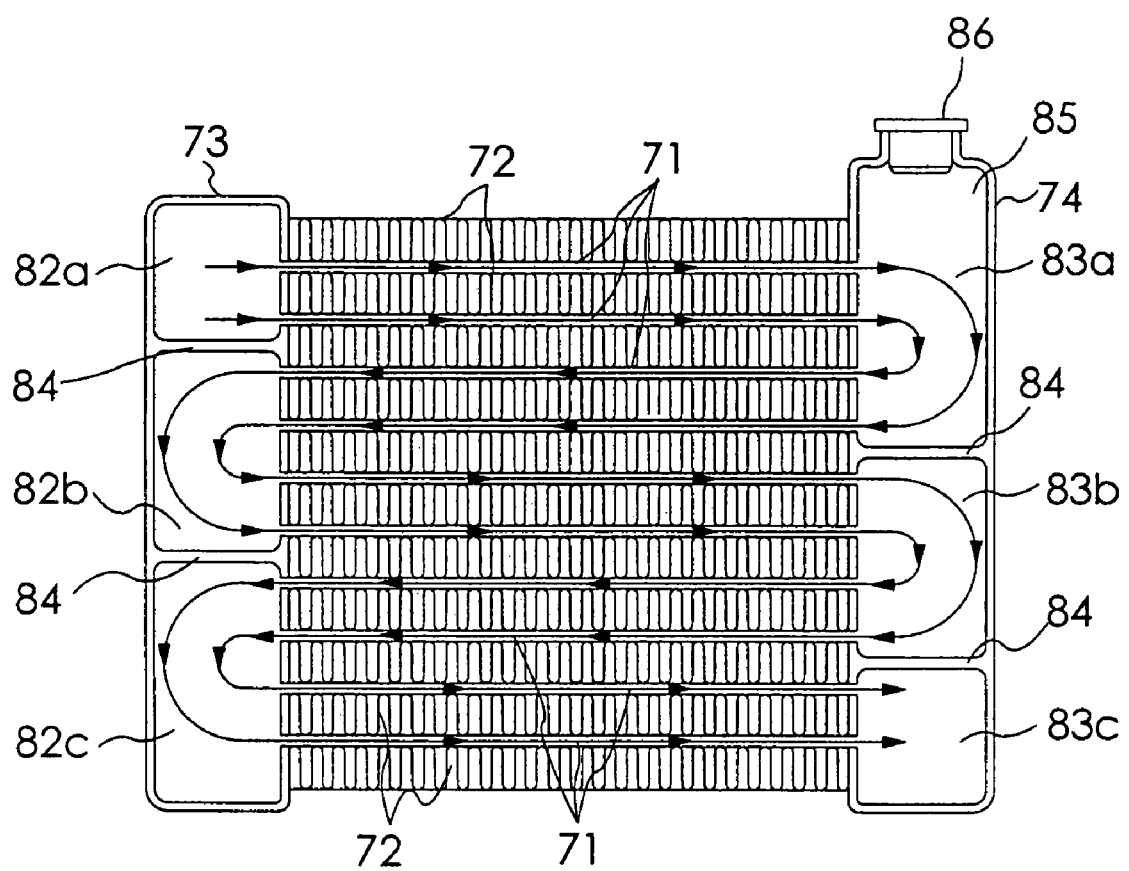
FIG. 9 is a schematic diagram showing a configuration of liquid paths in a radiator used in the electronic component cooling apparatus of FIG. 1.

The liquid tank 73 is provided with a cylindrical member 80 that constitutes a liquid inlet, and the liquid tank 74 with a cylindrical member 81 constituting a liquid outlet. In this radiator 7, as shown in FIG. 9, in the two tanks 73, 74 are each divided into three sub-chambers 82a-82c and 83a-83c by two partition walls 84 spaced in the direction of the parallel arrangement of the ten liquid passages 71. In this example, the sub-chamber 82a is communicably connected with upper two liquid passages 71 at one end; the sub-chamber 83a is communicably connected with upper four liquid passages 71 at the other end; the sub-chamber 82b is communicably connected with third to sixth four liquid passages 71 at one end; the sub-chamber 83b is communicably connected with fifth to eighth four liquid passages 71 at the other end; the sub-chamber 82c is communicably connected with seventh to tenth four liquid passages 71 at one end; and the sub-chamber 83c is communicably connected with ninth to tenth two liquid passages 71 at the other end. In other words, three sub-chambers 82a-82c and 83a-83c in each of the two tanks 73, 74 and the ten liquid passages 71 are connected with each other in such a manner that two liquid passages 71 construct a winding liquid path between the liquid inlet (80) and the liquid outlet (81). This arrangement enables a predetermined amount of liquid to be cooled in a relatively short period of time. It is also possible to connect a plurality of sub-chambers in the two tanks to a plurality of liquid passages to have only one liquid passage 71 serve as a liquid path winding between the liquid inlet and the liquid outlet.

The liquid path forming method adopted in this radiator 7 may be expressed in the following generalized term. A chamber in each of the two liquid tanks 73, 74 is divided, in a direction of arrangement of the plurality of liquid passages 71, into m plus one (m is an integer of one or more: three sub-chambers in this embodiment) sub-chambers 82a-82c, 83a-83c by m (two partition walls in this embodiment) partition walls 84. Then the sub-chambers 82a-82c, 83a-83c in each of the two liquid tanks and the plurality of liquid passages 71 are connected with each other in such a manner that one or more liquid passages (two passages in this embodiment) construct a winding liquid path between the liquid inlet 80 and the liquid outlet 81.

In this example, the two tanks 73, 74 are arranged so that the sub-chambers 82a, 83a are positioned at the upper end and the sub-chambers 82c, 83c are positioned at the lower end, respectively. The sub-chamber 83a in the tank 74 is situated higher than the sub-chamber 82a in the tank 73 and these sub-chambers are formed in such a dimension and shape so as to allow a space 85 to be defined therein that is not filled with the liquid. In this arrangement, the air that may cause bubbles in the liquid stays in the space 85, effectively preventing the air from getting into the liquid to cause the bubbles which in turn causes reduced cooling efficiency. A top part of the sub-chamber 83a in the tank 74 is attached with a coolant resupply cap 86 for replenishing a coolant.

Figure 10:
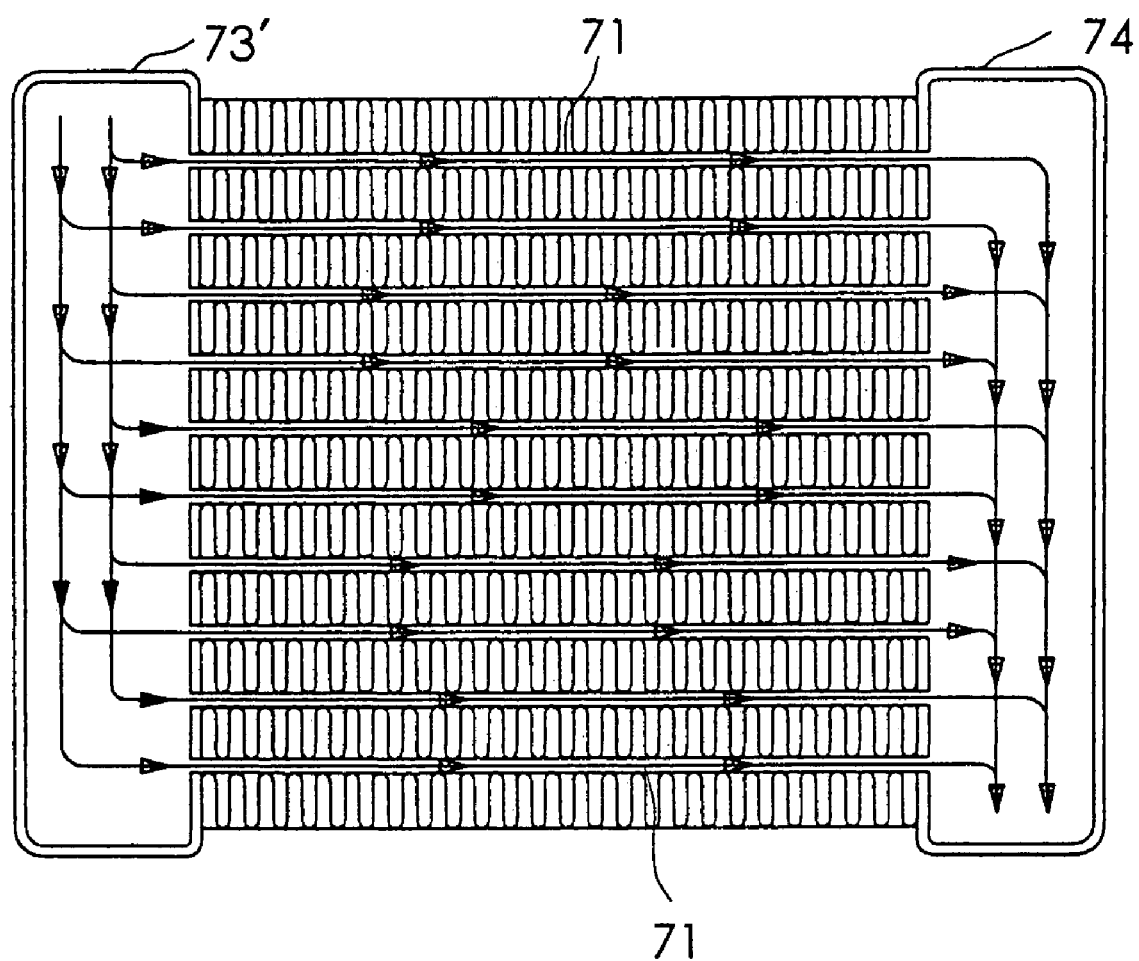
FIG. 10 is a schematic diagram showing another configuration of liquid paths in a radiator.

As shown in FIG. 10, it is also possible to adopt a known construction in which the interiors of the two tanks 73, 74 are not divided by partition walls.

Figure 11:
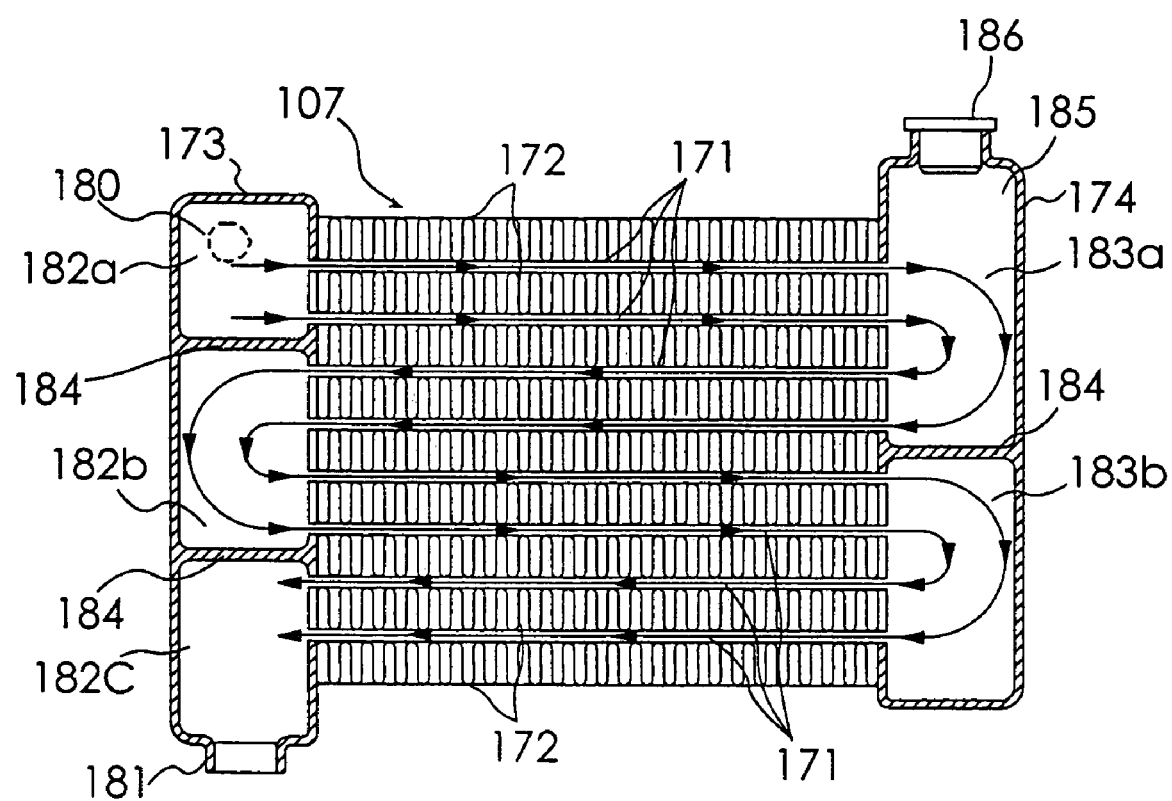
FIG. 11 is a schematic diagram showing a further configuration of liquid paths in a radiator.
Figure 12C:
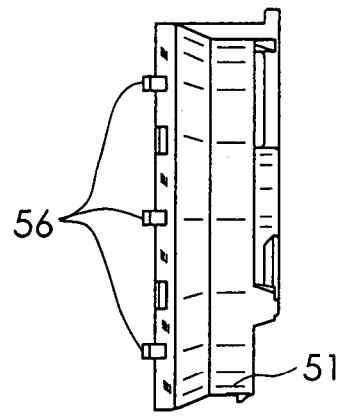
FIGS. 12A to 12D are a plan view, a front view, a left side view and a partly cutaway front view of a motor-driven fan used for air-cooling a radiator used in the electronic component cooling apparatus of FIG. 1.
Figure 12A:
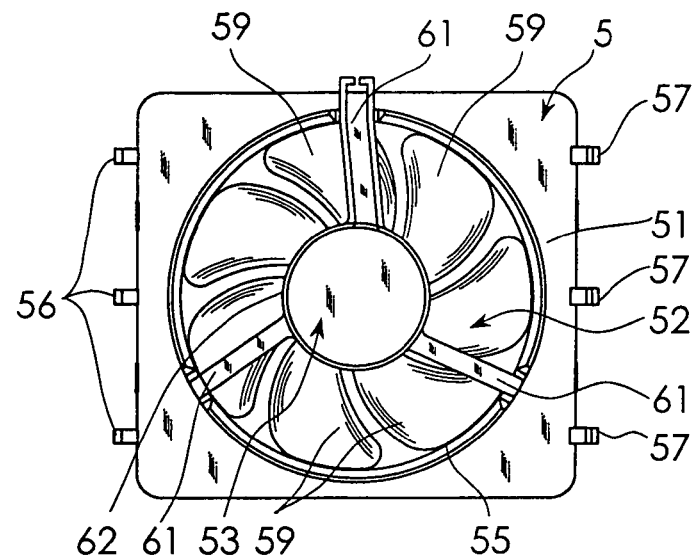
Figure 12B:
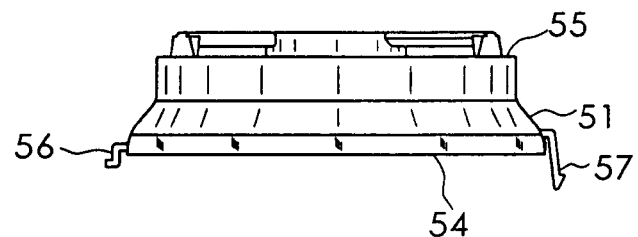
Figure 12D:
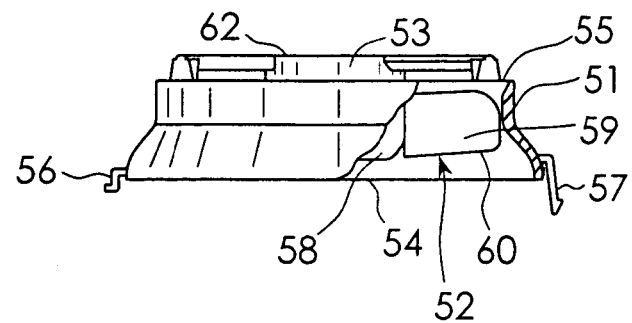

FIG. 11 shows the structure of another radiator. Regarding FIG. 11, the explanation of the parts is omitted by adding 100 to the corresponding number shown in FIG. 9. In this radiator 107, the chamber in the liquid tank 173 is divided into three sub-chambers 182a-182c by two partition walls 184 spaced in the direction of the parallel arrangement of the eight liquid passages 171. The chamber in the other liquid tank 174 is divided into two sub-chambers 183a, 183b by a partition wall 184 spaced in the direction of the parallel arrangement of the eight liquid passages 171. In this example, the sub-chamber 182a is communicably connected with upper two liquid passages 171 at one end; the sub-chamber 183a is communicably connected with upper four liquid passages 171 at the other end; the sub-chamber 182b is communicably connected with third to sixth four liquid passages 71 at one end; the sub-chamber 183*b* is communicably connected with fifth to eighth four liquid passages 171 at the other end; the sub-chamber 182*c* is communicably connected with seventh to eighth two liquid passages 171 at one end; the liquid inlet (a cylindrical member 180) and the liquid outlet (a cylindrical member 181) are provided in sub-chambers 182*a*, 182*c* respectively. engaging pieces engaging pieces engaged portions engaging pieces engaged portions engaging pieces engaging pieces.

The structure of sub-chambers of the radiator 107 may be expressed in the following generalized term. A chamber in the one liquid tank 173 is divided, in a direction of arrangement of the plurality of liquid passages 171, into n plus one (n is an integer of two or more: three sub-chambers in this embodiment) sub-chambers 182*a*-182*c* by n (two partition walls in this embodiment) partition walls 184. The other liquid tank 174 is divided, in a direction of arrangement of the plurality of liquid passages 171, into n (two sub chambers in this embodiment) sub chambers 183*a*, 183*b* by n–1 (one partition walls in this embodiment) partition walls 184. Then the sub-chambers 183*a*, 183*b* in the two liquid tanks173, 174 and the plurality of liquid passages 171 are connected with each other in such a manner that one or more of the liquid passages (two passages in this embodiment) construct a winding liquid path winding between the liquid inlet 180 and the liquid outlet 181.

FIGS. 12A to 12D are a front view, a left side view, a plan view and a partly cutaway front view of the motor-driven fan 5 used for air-cooling the radiator 7. The motor-drive fan 5 has an air channel body 51, an impeller 52 and a motor 53. At one end, the air channel body 51 has a suction port 54 facing the front of the heat dissipating portion 88 of the radiator 7 shown in FIG. 8 and, at the other end, a discharge port 55. The air channel body 51 has six engaging pieces 56, 57 integrally formed with an outer peripheral portion on the side of the suction port 54. The three engaging pieces 56 are so shaped that their front end portions are inserted and locked into three holes 79 provided, as engaged portions, at the mounting bracket 76 of the radiator 7. The three engaging pieces 57 are hook-shaped so that their front end portions are inserted and locked into three holes 78 provided, as engaged portions, at the mounting bracket 75 of the radiator 7. When the motor-driven fan 5 is to be mounted at the radiator 7, the engaging pieces 56 are inserted into the holes 79, and then the engaging pieces 57 are inserted into the holes 78 as being transformed.

The impeller 52 has a cup-shaped member 58 rotated by the motor 53 and seven blades 59 integrally mounted at a peripheral wall portion of the cup-shaped member 58. Edges 60 of the seven blades 59 facing the front of the heat dissipating portion 88 of the radiator 7 are sloping gradually away from the dissipating portion 88 as each of the edges extends in a radially outward direction from the rotating center of the impeller 52. This structure can reduce noise. In this motor-driven fan 5, three webs 61 connecting the housing 62 of the motor 53 and the end portion of the air channel body 51 on the side of the discharge port 55 are situated outside the discharge port 55. In other words, the end portion on the side of the discharge port is lower than the uppermost surface of the housing 62 of the motor 53. This arrangement can enhance an air blowing performance and reduce noise when compared with a construction in which the webs 61 are situated on the inner side of the discharge port 55.

The motor 53 rotates in such a direction that the impeller 52 is rotated to draw in air through the suction port 54 and discharge air through the discharge port 55. The construction that draws in air by the motor-driven fan 5 at the heat dissipating portion 88 of the radiator 7, as in this example, can draw out heated air through the heat dissipating portion 88 without unnecessarily increasing the rotation speed of the motor-driven fan 5 even when the heat dissipating portion 88 of the radiator 7 is complicatedly constructed. This construction can also reduce noise.

With the present invention, even when the amount of heat generated by electronic components increases, the heat sink can be positively cooled by means of a coolant, thereby significantly enhancing the cooling performance when compared with a conventional construction in which the heat sink is cooled only by means of air.

Further, the present invention is not limited to these embodiments, but various variations and modifications may be made without departing from the scope of the present invention.

What is claimed is:

1. An electronic component cooling apparatus comprising:
    a heat sink having an electronic component mounting surface on which an electronic component to be cooled is mounted and a coolant path with a coolant inlet and a coolant outlet through which a liquid flows as a coolant to forcibly cool the electronic component mounting surface;
    a radiator having a liquid path with a coolant inlet and a coolant outlet through which the coolant flows and adapted to air-cool the liquid path to cool the coolant;
    a motor-driven fan mounted at a heat dissipating portion of the radiator to supply cooling air to the radiator;
    a first coolant path connecting the coolant outlet of the heat sink to the coolant inlet of the radiator;
    a second coolant path connecting the coolant outlet of the radiator to the coolant inlet of the heat sink; and
    a motor-driven pump installed in the first coolant path or the second coolant path to give a moving energy to the coolant:
    wherein the motor-driven fan includes:
    an air channel body having a suction port at one end thereof facing a front of the heat dissipating portion of the radiator and a discharge port at the other end thereof;
    an impeller having a plurality of blades, at least a part of the impeller being arranged inside the air channel body, said plurality of blades each have an edge facing the front of the heat dissipating portion, each of the edges sloping gradually away from the heat dissipating portion as each of the edges extends in a radially outward direction from a rotating center of the impeller;
    a motor for rotating the impeller so as to draw in air through the suction port and discharge air from the discharge port; and a plurality of engaging pieces integrally provided at the air channel body; and
    wherein the radiator has a plurality of engaged portions with which the plurality of the engaging pieces engage.

2. The electronic component cooling apparatus as defined in claim 1, wherein a plurality of webs connecting a housing of the motor and an end portion of the air channel body on the side of the discharge port are situated outside the discharge port or the end portion on the side of the discharge port is lower than an uppermost surface of the housing of the motor.

3. An electronic component cooling apparatus comprising:
    a heat sink having an electronic component mounting surface on which an electronic component to be cooled is mounted and a coolant path with a coolant inlet and a coolant outlet through which a liquid flows as a coolant to forcibly cool the electronic component mounting surface;

a radiator having a liquid path with a coolant inlet and a coolant outlet through which the coolant flows and adapted to air-cool the liquid path to cool the coolant;

a motor-driven fan mounted at a heat dissipating portion of the radiator to supply cooling air to the radiator;

a first coolant path connecting the coolant outlet of the heat sink to the coolant inlet of the radiator;

a second coolant path connecting the coolant outlet of the radiator to the coolant inlet of the heat sink; and a motor-driven pump installed in the first coolant path or the second coolant path to give a moving energy to the coolant:

wherein the heat sink has a base plate which has the electronic component mounting surface and a heat dissipating surface, the heat dissipating surface being opposite to the electronic component mounting surface in a thickness direction of the base plate and in direct contact with the coolant, the heat dissipating surface being so shaped as to have at least one pair of sides facing each other;

wherein the heat sink has the coolant inlet and the coolant outlet so that the coolant can flow from one of the sides of the heat dissipating surface to the other side of the heat dissipating surface; and wherein the base plate is so shaped in a transverse cross section as to form one resistance increasing portion between the one side and the other side of the heat dissipating surface for increasing a resistance against a flow of the coolant, said one resistance increasing portion consisting of first to third portions, wherein:

the first portion being formed as an inclined surface that goes up from the one side such that the thickness of the resistance increasing portion gradually increases;

the second portion following the inclined surface and being formed as a non-inclined surface that extends so that the thickness of the resistance increasing portion is constant; and, the third portion following the non-inclined surface and being formed as another inclined surface that goes down toward the other side such that the thickness of the resistance increasing portion gradually decreases.

4. The electronic component cooling apparatus as defined in claim 3, wherein the heat dissipating surface has a plurality of radiation fins formed integrally therewith, and the plurality of radiation fins each extend in a first direction from the one side to the other side and are arranged along the heat dissipating surface at predetermined intervals in a second direction perpendicular to the first direction.

5. The electronic component cooling apparatus as defined in claim 4, wherein the heat sink has a top plate facing the base plate with a predetermined space therebetween and a peripheral wall portion connecting the base plate and the top plate, the coolant inlet and the coolant outlet are so formed near the one side and the other side respectively as to pierce through the top plate in a thickness direction thereof, and positions of both end portions, with respect to the first direction, of the plurality of radiation fins are so determined that flow speeds of the coolant do not vary excessively greatly among flow passages each formed between two adjacent radiation fins as the coolant flows in at the coolant inlet and flows out of the coolant outlet through the flow passages.

* * * * *